(12) United States Patent
Wang

(10) Patent No.: US 6,348,398 B1
(45) Date of Patent: Feb. 19, 2002

(54) METHOD OF FORMING PAD OPENINGS AND FUSE OPENINGS

(75) Inventor: Kun-Chih Wang, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/849,131

(22) Filed: May 4, 2001

(51) Int. Cl.⁷ .................................................. H01L 21/82
(52) U.S. Cl. ........................................ 438/601; 438/132
(58) Field of Search ................................ 438/132, 215, 438/281, 333, 467, 601

(56) References Cited

U.S. PATENT DOCUMENTS 5,985,765 A * 11/1999 Hsiao et al. ................. 438/694
6,235,557 B1 * 5/2001 Manley ....................... 438/132

* cited by examiner

Primary Examiner—Jey Tsai
(74) Attorney, Agent, or Firm—J.C. Patents

(57) ABSTRACT

A method of forming pad openings and fuse openings over a wafer. A wafer having pads and fuses thereon is provided. A passivation layer and a photoresist layer are sequentially formed over the wafer. A photo-exposure and development operation is conducted to remove the photoresist layer above the pads. An etching operation is conducted to remove the passivation layer above the pads as well as the photoresist layer and a portion of the passivation layer above the fuses. Finally, the photoresist layer is removed.

19 Claims, 3 Drawing Sheets

METHOD OF FORMING PAD OPENINGS AND FUSE OPENINGS

BACKGROUND OF THE INVENTION

1. Field of Invention

The present invention relates to a method of forming pad openings and fuse openings on the surface of a wafer. More particularly, the present invention relates to a method of forming pad openings and fuse openings on the surface of a wafer in a single photolithographic process.

2. Description of Related Art

A conventional method of forming pad openings and fuse openings on the surface of a wafer having bonding pads and safety fuses thereon includes sequentially forming a passivation layer and a photoresist layer over the wafer. This is followed by conducting photolithographic and etching processes to form the required openings over the pads and the fuses.

In the photolithographic and etching processes, the pad openings must be over-etched so that the passivation layer on the surface of each pad is completely removed and the underlying metallic layer is exposed. Similarly, the bottom of fuse openings and the space between the fuses are protected by a thick layer of passivation layer. However, the passivation layer on top of the pads and the passivation layer on top of the fuses are made from identical material in a single deposition process. Hence, the two passivation layers have identical thickness. Since both passivation layers are subjected to identical etching during photolithographic and etching processes, the fuses are exposed besides the pads. Thus, the wafer circuit is out of specification with the original design resulting in a drop in production yield.

In addition, resistance to etching for the passivation layer over pads is much higher than the passivation layer elsewhere. This is due to an additional photoresist layer over the passivation layer around the pad area. Because the area around the fuses is not protected by photoresist material, over-etching of the passivation layer on each side of the fuses to form trenches is highly likely. Ultimately, wafer circuit is damaged and production yield is lowered.

To reduce the over-etching problems, the etching process is slightly changed. A passivation layer and a photoresist layer are sequentially formed over a wafer having pads and fuses thereon. Thereafter, separate photolithographic and etching processes each having a different degree of etching are conducted to form the pad openings and the fuse openings.

Although the improved etching method can overcome the over-etching problem, two separate photolithographic and etching processes have to be conducted. This not only increases production time, but also increases cost of production.

SUMMARY OF THE INVENTION

Accordingly, one object of the present invention is to provide a method of forming pad openings and fuse openings over a wafer using a single photolithographic and etching operation. Hence, some processing steps are saved, production yield is increased and production cost is reduced.

To achieve these and other advantages and in accordance with the purpose of the invention, as embodied and broadly described herein, the invention provides a method of forming pad openings and fuse openings over a wafer. A wafer having pads and fuses thereon is provided. A passivation layer and a photoresist layer are sequentially formed over the wafer. A photo-exposure and development operation is carried out to remove the photoresist layer above the pads. An etching operation is conducted to remove the passivation layer above the pads as well as the photoresist layer and a portion of the passivation layer above the fuses. Finally, the photoresist layer is removed.

In this invention, a definite thickness of the photoresist layer is retained over the fuses after photo-exposure and development. In subsequent etching processes, etchants are prevented from over-etching and exposing the fuses while a pad over-etching operation is conducted. Since a passivation layer having a definite thickness is always retained at the bottom of the fuse opening and on each side of the fuses after the etching step, the fuses are protected from exposure. Ultimately, production yield of the wafer is increased and cost of production is lowered.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
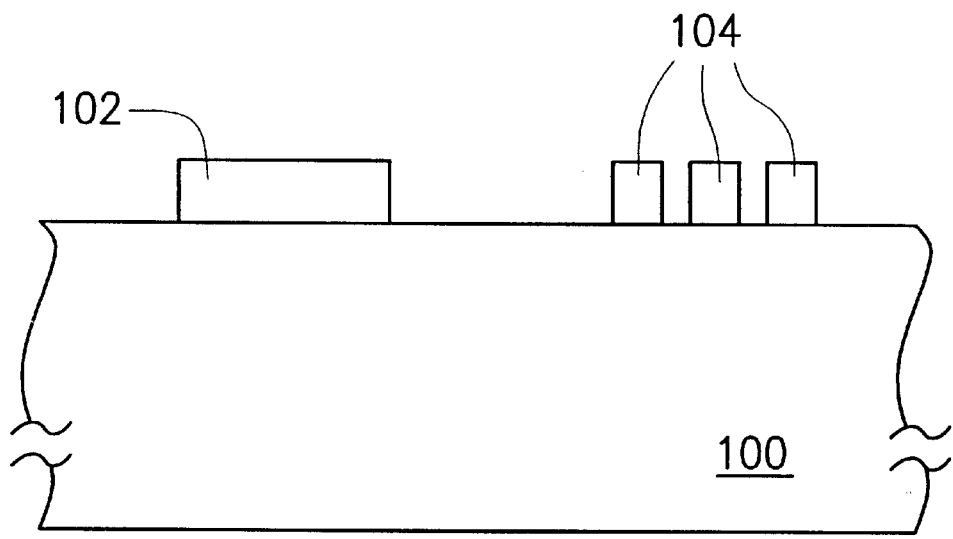
FIGS. 1 through 5 are schematic cross-sectional views showing the progression of steps for producing pad openings and fuse openings on a wafer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 5 are schematic cross-sectional views showing the progression of steps for producing pad openings and fuse openings on a wafer according to one preferred embodiment of this invention. As shown in FIG. 1, a metallic layer and a metallic passivation layer (not shown) are sequentially formed over a wafer 100. Photolithographic and etching processes are conducted to remove a portion of the metallic layer and the metallic passivation layer to form a bonding pad 102 and a fuse 104. The wafer 100 is a semiconductor device connected by metallic interconnects. Material comprising the metallic layer includes copper or aluminum and material comprising the metallic passivation layer includes copper oxide or aluminum oxide.

Figure 2:
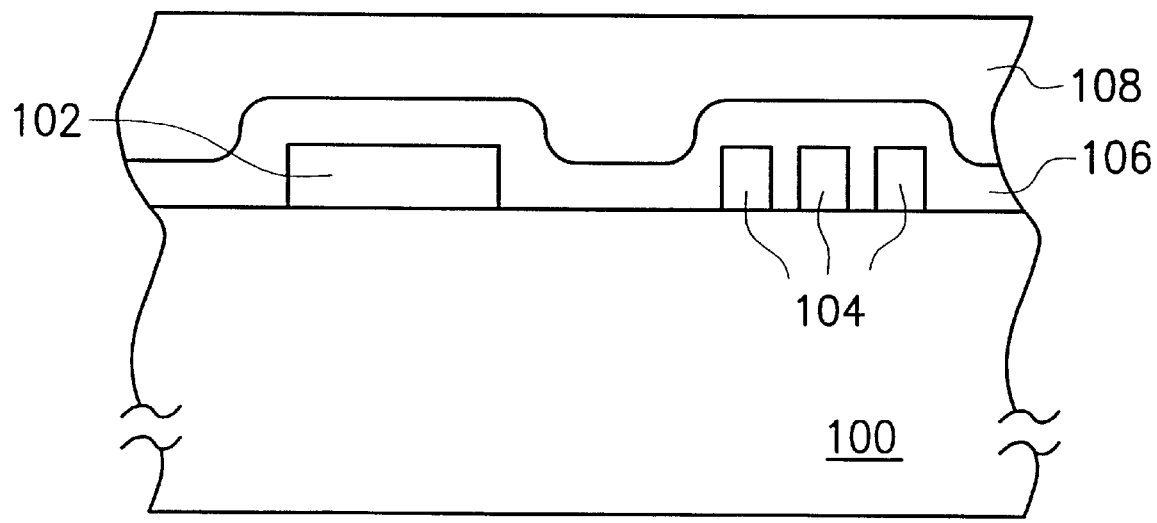

As shown in FIG. 2, a passivation layer 106 is formed over the wafer 100. The passivation layer 106 comprises of more than one layer of insulation material. The insulation material is selected from a group consisting of silicon nitride, oxide and oxynitride compound, for example. The passivation layer 106 is formed, for example, by chemical vapor deposition or physical vapor deposition. A planar photoresist layer 108 is next formed over the passivation layer 106. The photoresist layer 108 can be a positive photoresist layer or a negative photoresist layer. The photoresist layer 108 is formed, for example, by spin coating photoresist material over the passivation layer 106 and then soft baking the coated photoresist to drive away any solvent within the photoresist layer.

Figure 3:
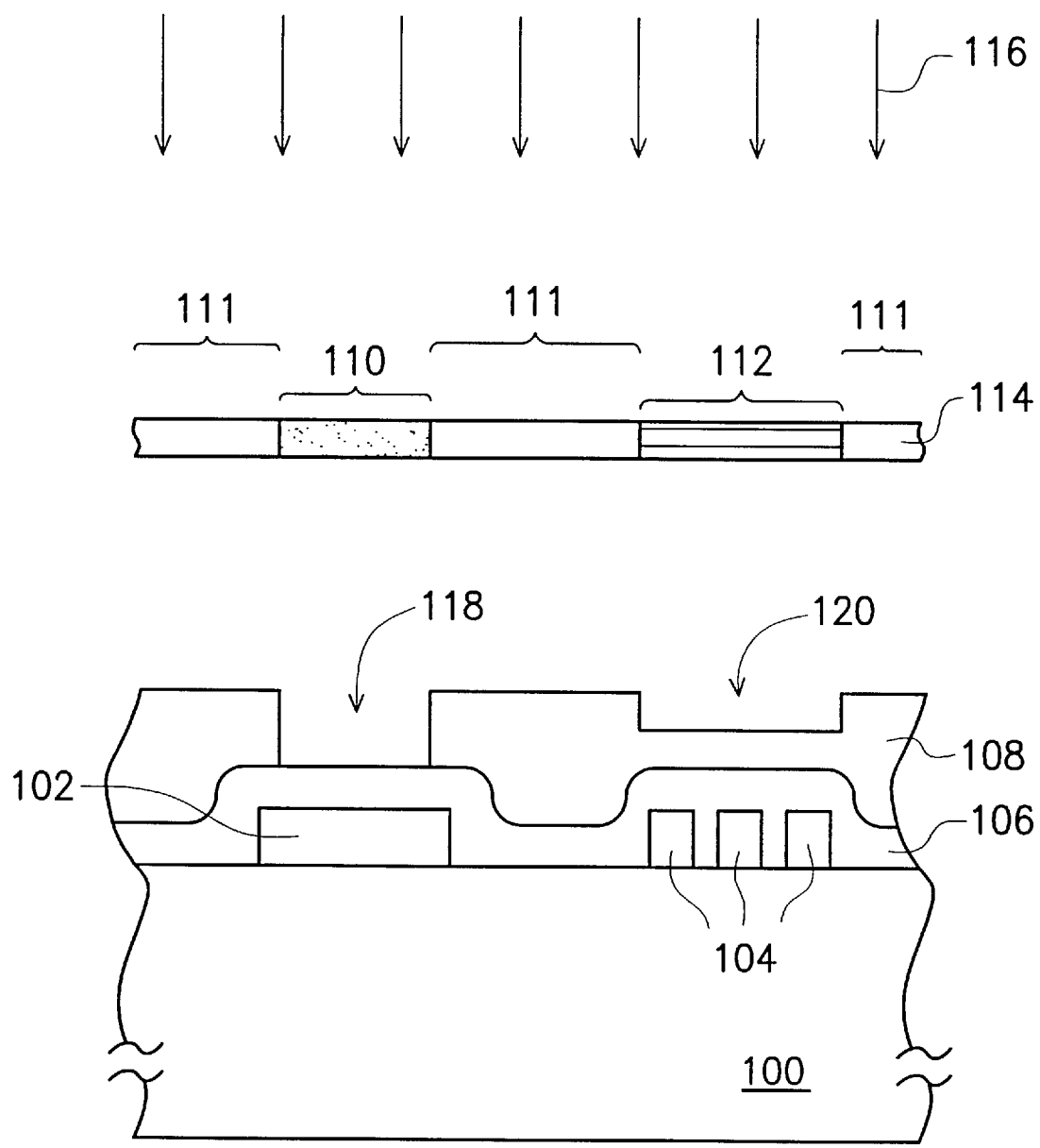

As shown in FIG. 3, a photo-exposure and development operation is conducted to remove a portion of the photoresist material from the photoresist layer 108. An opening 118 that exposes a portion of the passivation layer 106 is formed and a portion of the photoresist layer 108 above the fuse 104 is removed to form an opening 120. Thus, a layer of photoresist layer 108 having a definite thickness is retained between the bottom of the opening 120 and the fuse 104.

As an illustration in this embodiment, the photoresist layer 108 is a positive photoresist. Light from a light source shines on a bi-level mask 114 and carries out a photo-exposure of the photoresist layer 108. The portion on the bi-level mask 114 corresponding in position to the pad 102 is a fully transparent region 110 so that light from the light source 116 can completely penetrate. After photoresist development, the opening 118 that exposes the passivation layer 106 is formed in the photoresist layer 108. The portion on the bi-level mask 114 corresponding in position to the fuse 104 is a semi-transparent region 112 so that only a portion of the light from the light source 116 is allowed to pass through. After photoresist development, a portion of the photoresist layer 108 is removed forming the opening 120 and a definite thickness of the photoresist layer 108 is retained between the bottom of the opening 120 and the fuse 104. Outside the two aforementioned positions, the bi-level mask 114 has non-transparent regions 111 that completely block incoming light from the light source 116. Hence, the photoresist layer under the non-transparent region is retained after photo-exposure and development. If, however, a negative photoresist layer 108 is used, all that is required is to form a non-transparent region in the fully transparent region 110 and to form a fully transparent region in the non-transparent region 111.

The semi-transparent region 112 in the bi-level mask 114 is an area that lowers the energy transmitted from the light source 116 so that a definite thickness of the photoresist layer 118 is retained below the opening 120. In a subsequent etching, etchants will remove the residual photoresist material at the bottom of the opening 120 before encroaching upon the passivation layer 106 above the fuse 104. Hence, very little of the passivation layer 106 above the fuse 104 is ultimately removed by the etchant.

Figure 4:
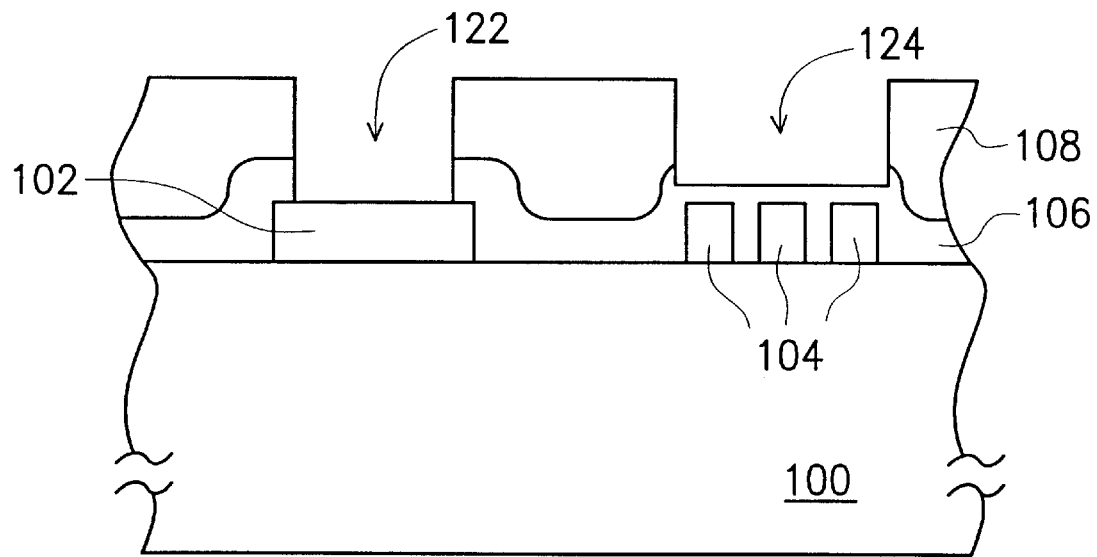

As shown in FIG. 4, an over-etching operation such as a dry etching is conducted using the patterned photoresist layer 108 as a mask to form a pad opening 122. After the etching step, the passivation layer 106 at the bottom of the opening 118 is completely removed so that a portion of the pad 102 is exposed. In the over-etching operation, dry-etching agent removes the photoresist layer 108 at the bottom of the opening 120 first. The etching agent will begin to remove the passivation layer 106 above the fuse 104 after the overlying photoresist layer 108 is completely removed. Therefore, a definite thickness of the passivation layer 106 is retained between the bottom of the fuse opening 124 and the fuse 104, thereby preventing any exposure of the fuse 104. In general, thickness of the fuse-protecting passivation layer depends on actual processing requirement.

Figure 5:
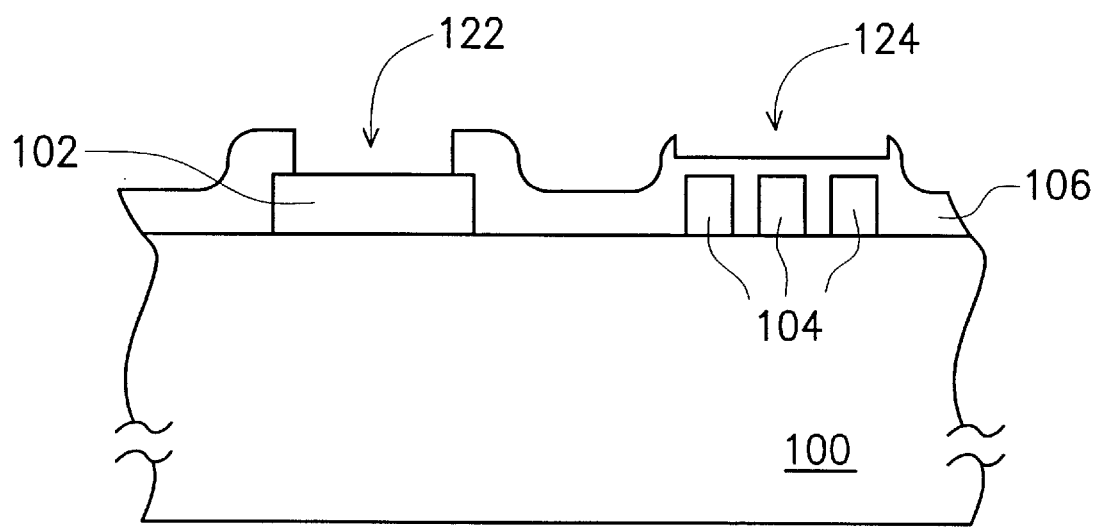

As shown in FIG. 5, the photoresist layer 108 is completely removed to expose the passivation layer 106 at the bottom of the fuse opening 124 and a portion of the pad 102 at the bottom of the pad opening 122. The photoresist layer 108 is removed, for example, by wet peeling or dry peeling.

In this invention, a definite thickness of the photoresist layer is retained over the fuses after photo-exposure and development. The photoresist layer serves as a buffer for preventing the etchants from over-etching and exposing the fuses while a pad over-etching operation is conducted. Consequently, a definite thickness of passivation layer is always retained at the bottom of the fuse opening and on each side of the fuses and the fuses are prevented from exposure. Ultimately, production yield of the wafer is increased and cost of production is lowered.

In addition, the pad openings and the fuse openings are formed over a wafer using just a single photolithographic and etching operation. Some processing steps are saved compared with a conventional method. Therefore, overall product yield is increased and production cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming pad openings and fuse openings on a wafer, comprising:

providing a wafer having a pad and a plurality of fuses thereon;

forming a passivation layer over the wafer;

forming a photoresist layer over the passivation layer;

performing a photo-exposure and a photoresist development operation to remove the photoresist layer above the pad and a portion of the photoresist layer above the fuses;

etching the passivation layer above the pad to form a pad opening that exposes the pad and sequentially etching the photoresist layer and a portion of the passivation layer above the fuses to form a fuse opening that exposes a portion of the passivation layer, using the patterned photoresist layer as a mask; and removing the photoresist layer.

2. The method of claim 1, wherein the photoresist layer includes a positive photoresist layer.

3. The method of claim 2, wherein performing a photo-exposure and a photoresist development operation further includes:

performing a photo-exposure operation to transfer a pattern from a bi-level mask to the photoresist layer, wherein the bi-level mask has a fully transparent region in an area corresponding to the pad, a semi-transparent region in an area corresponding to the fuses and a non-transparent region in an area outside the pad and the fuse; and developing the photoresist to remove the photoresist layer above the pad and partially remove the photoresist layer above the fuses.

4. The method of claim 1, wherein the photoresist layer includes a negative photoresist layer.

5. The method of claim 4, wherein performing a photo-exposure and a photoresist development operation further includes:

performing a photo-exposure operation to transfer a pattern from a bi-level mask to the photoresist layer, wherein the bi-level mask has a non-transparent region in an area corresponding to the pad, a semi-transparent region in an area corresponding to the fuses and a fully transparent region in an area outside the pad and the fuse; and developing the photoresist to remove the photoresist layer above the pad and partially remove the photoresist layer above the fuses.

6. The method of claim 1, wherein after etching the passivation layer, an over-etching operation is further conducted.

7. The method of claim 1, wherein the passivation layer comprises two or more insulation layers.

8. The method of claim 7, wherein an insulation layer material is selected from a group consisting of silicon nitride, oxide and oxynitride compound.

9. A method of forming pad openings and fuse openings on a wafer, comprising:

providing a wafer having a pad and a fuse thereon;

forming a passivation layer over the wafer;

forming a photoresist layer over the passivation layer;

performing a photo-exposure and a photoresist development operation by transferring a photoresist pattern from a bi-level mask to the photoresist layer and removing the photoresist layer above the pad and a portion of the photoresist layer above the fuses, wherein the bi-level mask has a non-transparent region in an area corresponding to the pad, a semi-transparent region in an area corresponding to the fuses and a fully transparent region in an area outside the pad and the fuse;

etching the passivation layer above the pad to form a pad opening that exposes the pad and sequentially etching the photoresist layer and a portion of the passivation layer above the fuses to form a fuse opening that exposes a portion of the passivation layer, using the patterned photoresist layer as a mask; and removing the photoresist layer.

10. The method of claim 9, wherein the photoresist layer includes a positive photoresist layer.

11. The method of claim 9, wherein after etching the passivation layer, an overetching operation is further conducted.

12. The method of claim 9, wherein the passivation layer comprises two or more insulation layers.

13. The method of claim 9, wherein an insulation layer material is selected from a group consisting of silicon nitride, oxide and oxynitride compound.

14. A method of forming pad openings and fuse openings on a wafer, comprising:

providing a wafer having a pad and a fuse thereon;

forming a passivation layer over the wafer;

forming a photoresist layer over the passivation layer, wherein the photoresist layer includes a first opening and a second opening, the first opening is above the pad and exposes the passivation layer, and the second opening is above the fuse but does not expose the passivation layer;

etching the passivation layer at a bottom of the first opening to form a pad opening that exposes the pad and sequentially etching the photoresist layer and a portion of the passivation layer at a bottom of the second opening to form a fuse opening that exposes a portion of the passivation layer, using the patterned photoresist layer as a mask; and removing the photoresist layer.

15. The method of claim 14, wherein forming the photoresist layer further includes:

forming a positive photoresist layer over the passivation layer;

performing a photo-exposure operation to transfer a pattern from a bi-level mask to the positive photoresist layer, wherein the bi-level mask has a fully transparent region in an area corresponding to the pad, a semi-transparent region in an area corresponding to the fuses and a non-transparent region in an area outside the pad and the fuse; and developing the positive photoresist to remove the positive photoresist layer above the pad and partially remove the positive photoresist layer above the fuses, thereby forming the first opening and the second opening.

16. The method of claim 14, wherein forming the photoresist layer further includes:

forming a negative photoresist layer over the passivation layer;

performing a photo-exposure operation to transfer a pattern from a bi-level mask to the negative photoresist layer, wherein the bi-level mask has a non-transparent region in an area corresponding to the pad, a semi-transparent region in an area corresponding to the fuses and a fully transparent region in an area outside the pad and the fuse; and developing the negative photoresist to remove the negative photoresist layer above the pad and partially remove the negative photoresist layer above the fuses, thereby forming the first opening and the second opening.

17. The method of claim 14, wherein the passivation layer comprises two or more insulation layers.

18. The method of claim 14, wherein an insulation layer material is selected from a group consisting of silicon nitride, oxide and oxynitride compound.

19. The method of claim 14, wherein after etching the passivation layer, an over-etching operation is further conducted.

* * * * *